United States Patent
Choi et al.

(10) Patent No.: US 11,366,172 B2
(45) Date of Patent: Jun. 21, 2022

(54) APPARATUS AND METHOD FOR DIAGNOSING BATTERY

(71) Applicant: KOREA ELECTRIC POWER CORPORATION, Naju-si (KR)

(72) Inventors: Jin Hyeok Choi, Daejeon (KR); Ji Hun Lim, Daejeon (KR); Sung Eun Lee, Daejeon (KR)

(73) Assignee: KOREA ELECTRIC POWER CORPORATION, Naju-si (KR)

( * ) Notice: Subject to any disclaimer, the term of this patent is extended or adjusted under 35 U.S.C. 154(b) by 65 days.

(21) Appl. No.: 16/956,538

(22) PCT Filed: Jul. 24, 2018

(86) PCT No.: PCT/KR2018/008316
§ 371 (c)(1),
(2) Date: Jun. 19, 2020

(87) PCT Pub. No.: WO2020/022527
PCT Pub. Date: Jan. 30, 2020

(65) Prior Publication Data
US 2021/0011089 A1    Jan. 14, 2021

(51) Int. Cl.
*G01R 31/392*    (2019.01)
*G01R 31/389*    (2019.01)
*G01R 31/388*    (2019.01)
*H02J 7/00*    (2006.01)
*H01M 10/48*    (2006.01)

(52) U.S. Cl.
CPC ......... *G01R 31/392* (2019.01); *G01R 31/388* (2019.01); *G01R 31/389* (2019.01); *H01M 10/486* (2013.01); *H02J 7/005* (2020.01); *H02J 7/0049* (2020.01); *H02J 2207/20* (2020.01)

(58) Field of Classification Search
None
See application file for complete search history.

(56) References Cited

U.S. PATENT DOCUMENTS

2013/0132011 A1*    5/2013   Mano ............... H02J 7/0013
                                                702/63
2017/0343613 A1*    11/2017  Frost ............... G01R 31/367

FOREIGN PATENT DOCUMENTS

| JP | 2003-23704 A | 1/2003 |
| KR | 10-2011-0053001 A | 5/2011 |
| KR | 10-2016-0046817 A | 4/2016 |
| KR | 10-2016-0144658 A | 12/2016 |
| KR | 10-1855941 B1 | 5/2018 |
| WO | 2017-130614 A1 | 8/2017 |

* cited by examiner

*Primary Examiner* — Jas A Sanghera
(74) *Attorney, Agent, or Firm* — Foundation Law Group, LLP (57) ABSTRACT

The present invention relates to an apparatus and a method for diagnosing a battery, and comprises: a power conversion unit for discharging and charging a battery; and a control unit for controlling the power conversion unit to discharge and charge the battery, and diagnosing power fade of the battery by calculating a maximum discharge output and a maximum charge output of the battery on the basis of a voltage and a current of the battery measured during discharging and charging of the battery.

15 Claims, 8 Drawing Sheets

APPARATUS AND METHOD FOR DIAGNOSING BATTERY

TECHNICAL FIELD

The present invention relates to a battery diagnostic apparatus and a method of diagnosing a battery, and more specifically, to a battery diagnostic apparatus which diagnoses power degradation and capacity degradation of a battery and a method of diagnosing a battery.

BACKGROUND ART

Generally, an energy storage system (ESS)(or energy storage device) refers to a device which charges a battery with electrical energy and then supplies energy to a load when necessary. The energy storage device has been used for main purposes of smoothing a power peak through charging and discharging, stabilizing power characteristics of wind and solar power having discontinuous power characteristics, and adjusting a frequency of a power system.

In an energy storage system, since a battery for charging with electrical energy repeats charging and discharging and thus is continuously aged, capacity gradually decreases and resistance increases. That is, the battery cannot be permanently used, and thus should be repaired or replaced before problems due to aging occur.

Performance degradation of the battery used in the energy storage system may include capacity degradation (capacity fade) in which the capacity decreases due to aging, and power degradation (power fade) which does not satisfy the rated power required for charging and discharging due to degradation of power characteristics of the battery. The capacity degradation and the power degradation differ in their degradation mechanisms, and there may be differences in importance according to an application field of the energy storage system. Specifically, in the case of the energy storage system for frequency adjustment which adjusts a frequency of the power system, since immediate charging and discharging should be performed in a short time, the power performance of the energy storage system is more important, and accordingly, it is necessary to periodically evaluate the power characteristics of the battery.

Figure 1:
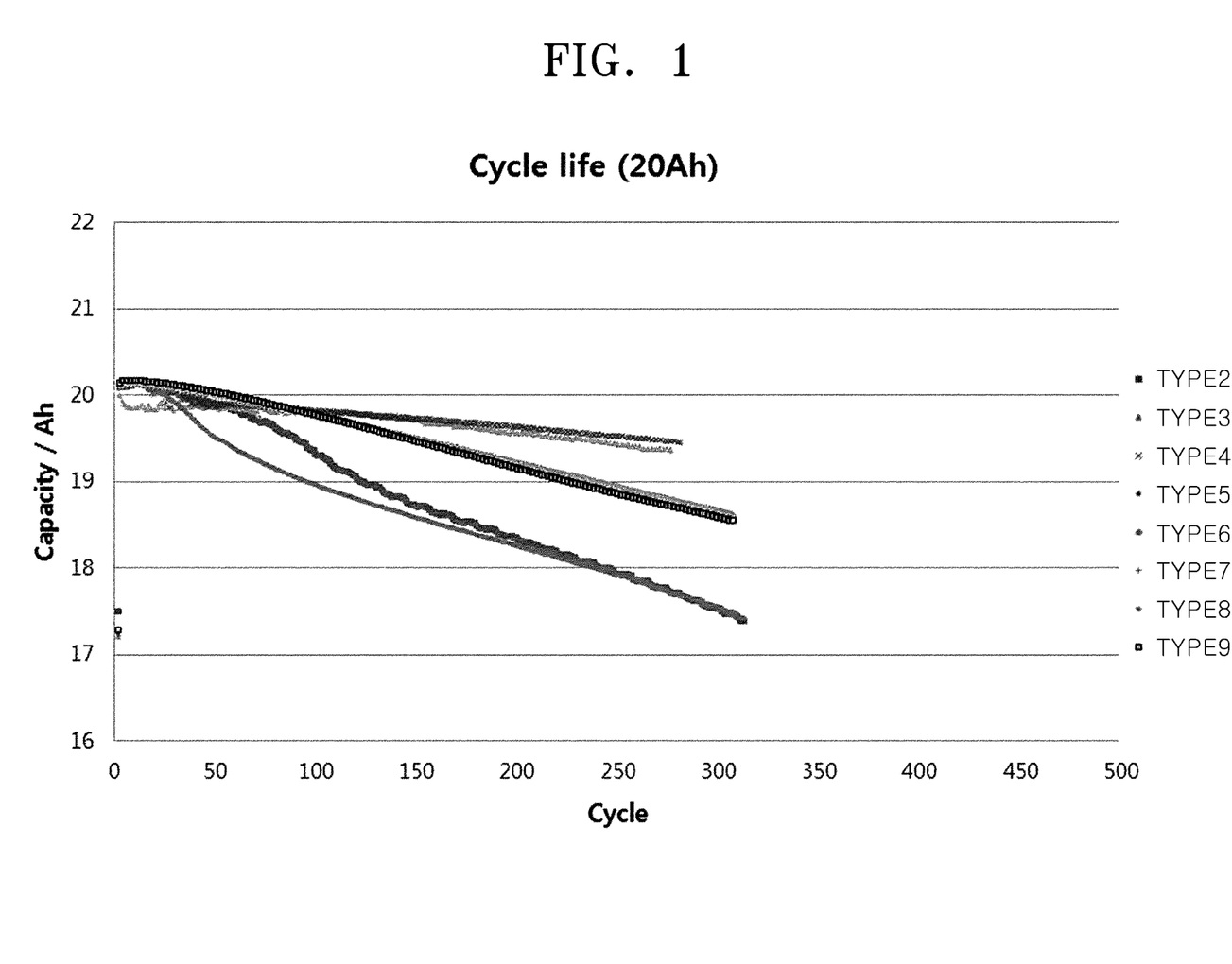
FIG. 1 is an exemplary diagram for describing capacity degradation of a conventional battery.

Conventionally, as shown in FIG. 1, since performance degradation diagnosis for an energy storage system was mainly limited to evaluating capacity degradation and power characteristic evaluation which diagnoses the power degradation by measuring the power characteristics of the battery during charging and discharging has not been applied to an operation process of the energy storage system, a system which improves the operational efficiency of the energy storage system by comprehensively evaluating capacity degradation and power degradation is required.

Background art of the present invention is disclosed in Korean Laid-Open Patent Publication No. 10-2016-0144658 (disclosed on Dec. 19, 2016).

DISCLOSURE

Technical Problem

The present invention is directed to providing a battery diagnostic apparatus which comprehensively determines a system degradation degree including power degradation and capacity degradation of a battery, and predicts whether the battery is abnormal in advance so that operation, maintenance, and repair of the battery are facilitated, and a method of diagnosing a battery.

Technical Solution

One aspect of the present invention provides a battery diagnostic apparatus including: a power conversion unit configured to perform discharging and charging of a battery; and a control unit configured to control the power conversion unit to discharge and charge the battery, and calculate a maximum discharge power and a maximum charge power of the battery on the basis of a voltage and a current of the battery measured during discharging and charging of the battery to diagnose power degradation of the battery.

In the present invention, the control unit may control the power conversion unit to draw a discharge current having a first set magnitude from the battery and discharge the battery, and to supply a charge current having a second set magnitude to the battery and charge the battery.

In the present invention, the control unit may calculate a discharge internal resistance value on the basis of a voltage of the battery at the start of discharging, a voltage of the battery at the end of discharging, and the discharge current, and may calculate the maximum discharge power on the basis of the calculated discharge internal resistance value.

In the present invention, the control unit may calculate a charge internal resistance value on the basis of a voltage of the battery at the start of charging, a voltage of the battery at the end of charging, and the charge current, and may calculate the maximum charge power on the basis of the calculated charge internal resistance value.

In the present invention, the control unit may calculate the maximum discharge power and the maximum charge power for each of a plurality of set SOCs while sequentially adjusting a state of charge (SOC) of the battery to each of the plurality of set SOCs, and may diagnose power degradation for each SOC of the battery using the maximum discharge power and the maximum charge power calculated for each SOC.

In the present invention, the control unit may determine a usable SOC range for operating the battery on the basis of a diagnosis result of the power degradation for each SOC of the battery.

In the present invention, the control unit may diagnose power degradation by temperature according to a temperature of the battery.

In the present invention, the control unit may respectively compare the calculated maximum discharge power and maximum charge power with a required discharge power and a required charge power, which are preset, to diagnose the power degradation of the battery.

In the present invention, the control unit may determine a discharge capacity of the battery on the basis of a discharge current measured while a fully charged battery is fully discharged, and may further diagnose capacity degradation of the battery through a variation amount of the discharge capacity.

Another aspect of the present invention provides a method of diagnosing a battery including: controlling, by a control unit, a power conversion unit configured to perform discharging and charging of a battery to discharge and charge the battery and calculating a maximum discharge power and a maximum charge power of the battery on the basis of a voltage and a current of the battery measured during discharging and charging of the battery; and diagnosing, by the control unit, power degradation of the battery using the calculated maximum discharge power and maximum charge power.

In the present invention, the calculating of the maximum discharge power and the maximum charge power may include controlling, by the control unit, the power conversion unit to discharge the battery and calculating the maximum discharge power of the battery on the basis of a voltage and a current of the battery measured when the battery is discharged, and controlling, by the control unit, the power conversion unit to charge the battery and calculating the maximum charge power of the battery on the basis of a voltage and a current of the battery measured when the battery is charged.

In the present invention, the control unit may control the power conversion unit to draw a discharge current having a first set magnitude from the battery to discharge the battery, calculate a discharge internal resistance value on the basis of a voltage of the battery at the start of discharging, a voltage of the battery at the end of discharging, and the discharge current, and calculate the maximum discharge power on the basis of the calculated discharge internal resistance value, in the operation of calculating the maximum discharge power.

In the present invention, the control unit may control the power conversion unit to supply a charge current having a second set magnitude to the battery to charge the battery, calculate a charge internal resistance value on the basis of a voltage of the battery at the start of charging, a voltage of the battery at the end of charging, and the charge current, and calculate the maximum charge power on the basis of the calculated charge internal resistance value, in the operation of calculating the maximum charge power.

In the present invention, the control unit may calculate the maximum discharge power and the maximum charge power for each of a plurality of set SOCs while sequentially adjusting a state of charge (SOC) of the battery to each of a plurality of set SOCs in the operation of calculating, and may diagnose power degradation for each SOC of the battery using the maximum discharge power and the maximum charge power calculated for each SOC in the operation of diagnosing.

In the present invention, the method may further include determining, by the control unit, a usable SOC range for operating the battery on the basis of a diagnosis result of the power degradation for each SOC of the battery.

In the present invention, the control unit may respectively compare the calculated maximum discharge power and maximum charge power with a required discharge power and a required charge power, which are preset, to diagnose the power degradation of the battery in the operation of diagnosing.

In the present invention, the method may further include determining, by the control unit, a discharge capacity of the battery on the basis of a discharge current measured while a fully charged battery is fully discharged, and diagnosing capacity degradation of the battery through a variation amount of the discharge capacity.

Advantageous Effects

According to one aspect of the present invention, the present invention can more accurately diagnose stability and performance degradation of an entire system through a method of directly measuring a power degradation degree at a system level without depending on a state of health (SOH) calculated in a battery managing system, and can improve the operation efficiency of an energy storage system by predicting the power of a battery using the diagnosis result.

Further, according to one aspect of the present invention, the present invention can operate the energy storage system for long time by diagnosing power characteristics of the battery for each SOC of the battery, and operating the energy storage system in the SOC range where a required power can be normally expressed.

MODES OF THE INVENTION

Hereinafter, embodiments of a battery diagnostic apparatus and a method thereof according to the present invention will be described with reference to the accompanying drawings. In this process, thicknesses of lines, sizes of components, or the like shown in the drawings may be exaggerated for clarity and convenience of the description. Further, terms which will be described later are terms defined in consideration of functions in the present invention and may vary according to intentions or customs of a user or an operator. Accordingly, these terms should be defined on the basis of the content throughout the present specification.

Hereinafter, in order to help understanding of the present embodiment, an embodiment in which the performance of a battery provided in an energy storage system is diagnosed will be described, but the present embodiment may be applied to configurations which diagnose performance degradation of all types of batteries which are charged and discharged to supply stored electrical energy to a load, in addition to the energy storage system. Further, the battery of the present embodiment may include a single cell, a module in which the single cell is connected in series or in parallel, a rack in which the modules are connected in series or in parallel, and a system level battery in which the racks are connected in series or in parallel.

Figure 2:
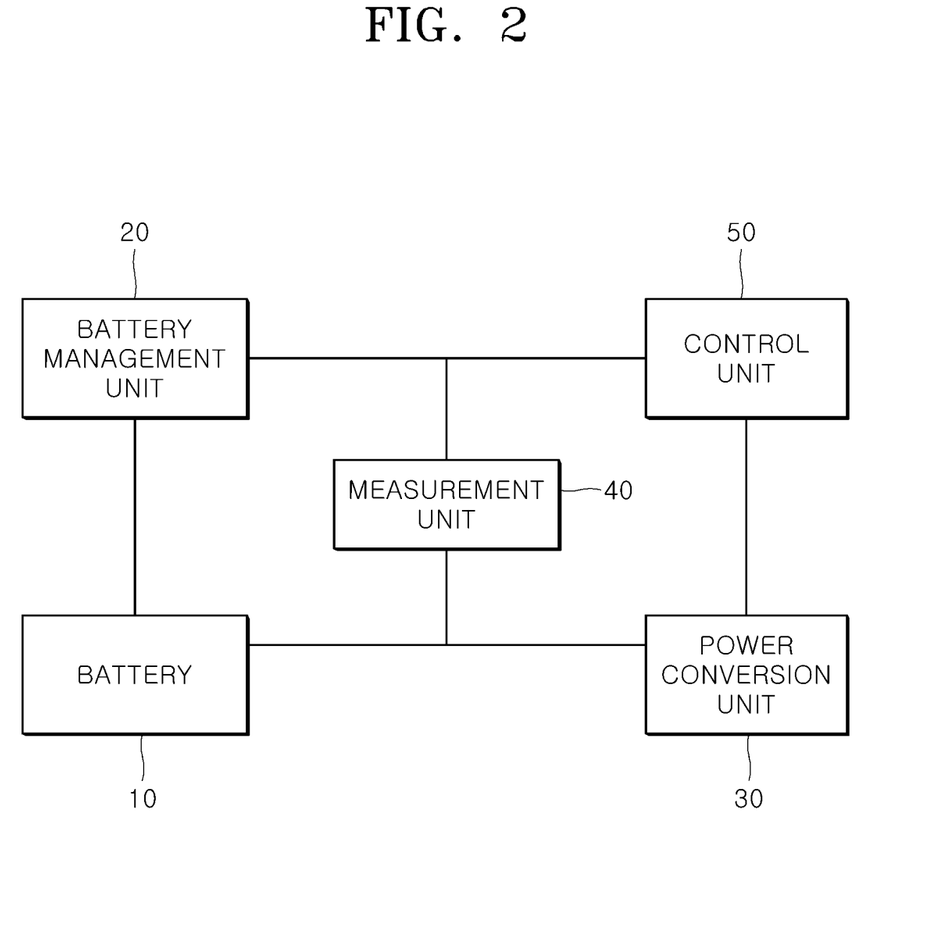
FIG. 2 is a block configuration diagram for describing a battery diagnostic apparatus according to one embodiment of the present invention.
Figure 3:
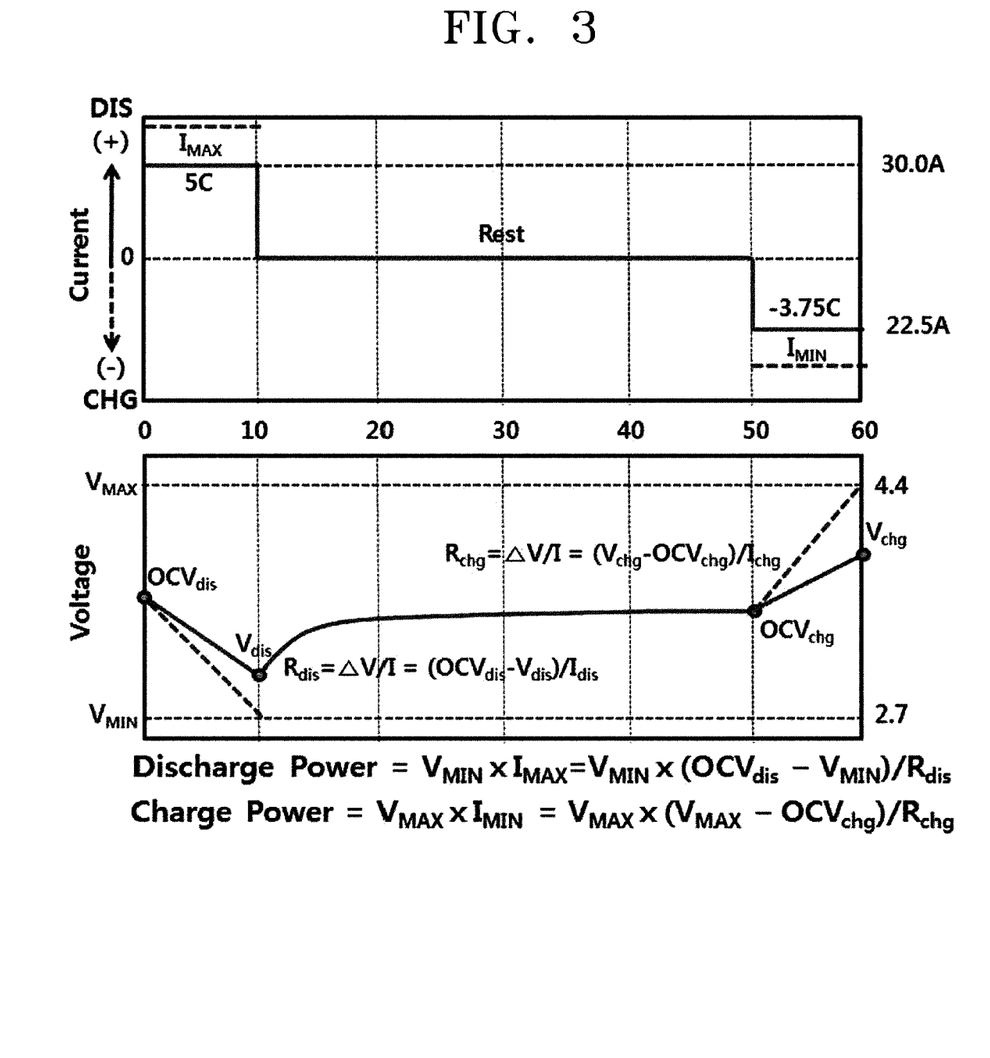
FIG. 3 is an exemplary diagram for describing a process of calculating a maximum discharge power and a maximum charge power in the battery diagnostic apparatus according to one embodiment of the present invention.
Figure 4:
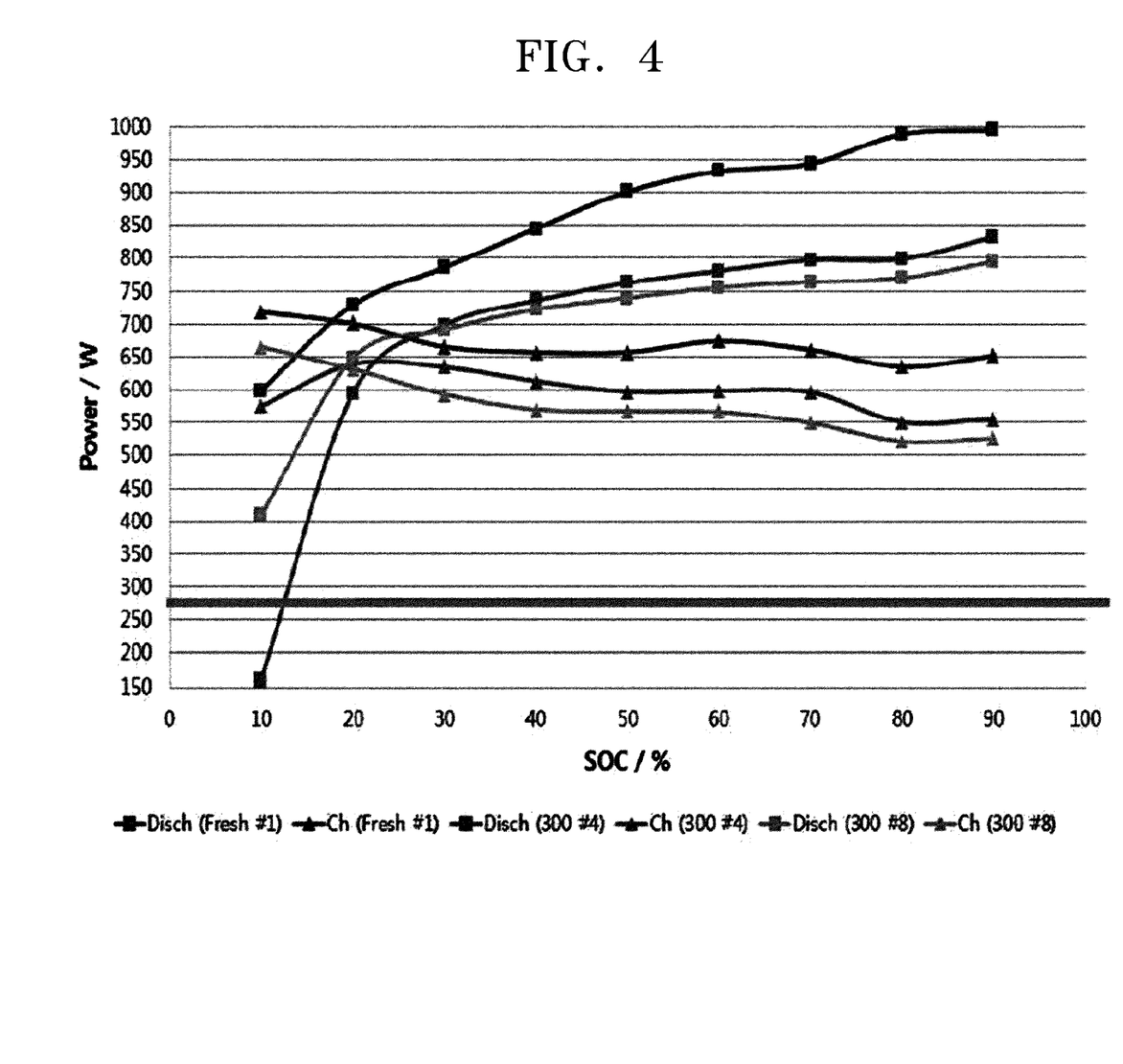
FIG. 4 is an exemplary diagram illustrating a diagnosis result of power degradation of each state of charge (SOC) of the battery in the battery diagnostic apparatus according to one embodiment of the present invention.
Figure 5:
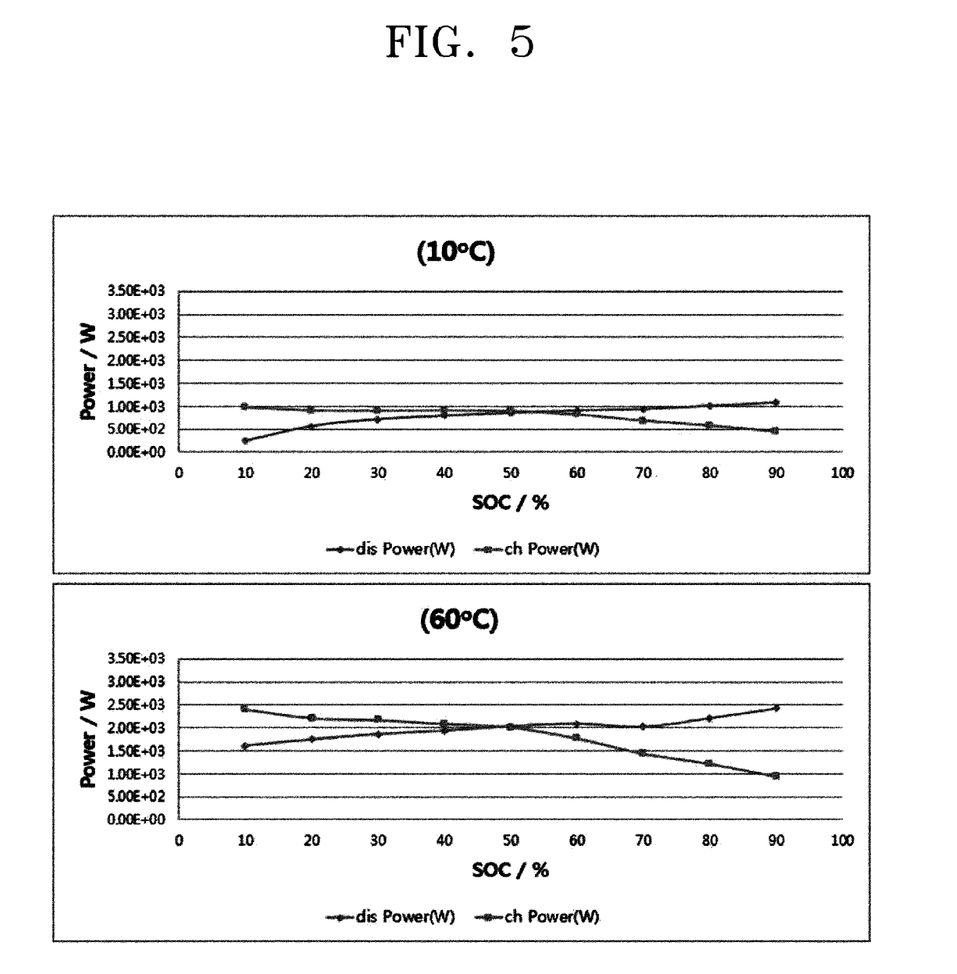
FIG. 5 is an exemplary diagram illustrating a result of diagnosing power degradation by temperature of the battery in the battery diagnostic apparatus according to one embodiment of the present invention.

FIG. 2 is a block configuration diagram for describing a battery diagnostic apparatus according to one embodiment of the present invention, FIG. 3 is an exemplary diagram for describing a process of calculating a maximum discharge power and a maximum charge power in the battery diagnostic apparatus according to one embodiment of the present invention, FIG. 4 is an exemplary diagram illustrating a diagnosis result of a power degradation degree of each state of charge (SOC) of the battery in the battery diagnostic apparatus according to one embodiment of the present invention, and FIG. 5 is an exemplary diagram illustrating a result of diagnosing a power degradation degree by temperature of the battery in the battery diagnostic apparatus according to one embodiment of the present invention.

Referring to FIG. 2, the battery diagnostic apparatus according to one embodiment of the present invention may include a battery 10, a battery management unit 20, a power conversion unit 30, a measurement unit 40, and a control unit 50.

The battery 10 refers to a secondary battery which is provided with a positive electrode plate and a negative electrode plate and thus may be charged and discharged by a chemical action, and may be configured as a lithium battery (Li battery), a sodium-sulfur battery (NaS battery), a redox flow battery, a nickel-cadmium battery (Ni—Cd battery), or a super capacitor, but is not limited thereto. Further, as described above, the battery may include a single cell, a module, a rack, and a system level battery.

The battery management unit 20 is connected to the battery 10, and may obtain battery state information including a voltage, a current, a temperature, and a state of charge (SOC) of the battery 10, and then transfer the battery state information to the control unit 50 to be described later. The battery management unit 20 may be implemented as a battery management system (BMS) which is provided in an energy storage system and monitors a state of the battery 10.

The power conversion unit 30 may serve to provide compatibility between a power system and the battery 10 through power conversion by converting AC power from a power generation source into DC power and storing the DC power in the battery 10, or converting DC power from the battery 10 into AC power and supplying the AC power to the power system. In the present embodiment, the power conversion unit 30 may be controlled by the control unit 50 to perform discharging and charging of the battery 10, and accordingly, as will be described later, a current of a predetermined pulse pattern may be drawn from the battery 10 or supplied to the battery 10 to charge or discharge the battery 10. Meanwhile, the power conversion unit 30 may be implemented as a power conditioning system (PCS) provided in the energy storage system.

When the battery 10 is discharged and charged by the power conversion unit 30, the measurement unit 40 may measure the voltage and current during discharging and charging and deliver the measured voltage and current to the control unit 50. As will be described later, the voltage and current of the battery 10 measured by the measurement unit 40 may be used to calculate a maximum discharge power and a maximum charge power of the battery 10.

The control unit 50 may diagnose power degradation of the battery 10 by controlling the power conversion unit 30 to discharge and charge the battery 10, and calculating the maximum discharge power and the maximum charge power of the battery 10 on the basis of the voltage and current of the battery 10 measured by the measurement unit 40 when the battery 10 is discharged and charged. As described above, the power degradation is defined as a case in which power characteristics of the battery 10 are degraded and thus the rated power required when the battery 10 is discharged and charged is not satisfied.

Hereinafter, a process of diagnosing the power degradation of the battery 10 by calculating the maximum discharge power and the maximum charge power of the battery 10 will be specifically described on the basis of operations of the control unit 50 and the power conversion unit 30.

In order to calculate the maximum discharge power and the maximum charge power, first, the control unit 50 may control the power conversion unit 30 to discharge and charge the battery 10. In this case, the control unit 50 may discharge the battery 10 by controlling the power conversion unit 30 to draw a discharge current having a first set magnitude from the battery 10, and may charge the battery 10 by supplying a charge current having a second set magnitude to the battery 10.

Specifically, as shown in FIG. 3, the control unit 50 may control the power conversion unit 30 to discharge the battery 10 by drawing the discharge current having the first set magnitude (for example, a current 5 times the capacity (5C rate) of the battery 10) from the battery 10 for a set time (for example, ten seconds). In this case, the control unit 50 may calculate a discharge internal resistance value on the basis of a voltage of the battery 10 at the start of discharging, a voltage of the battery 10 at the end of discharging, and the discharge current. That is, since a voltage drop amount when the battery 10 is discharged depends on the product of the magnitude of the discharge current drawn from the battery 10 and the discharge internal resistance value, the discharge internal resistance value may be calculated according to the following Equation 1.

$$R_{dis} = \frac{(OCV_{dis} - V_{dis})}{I_{dis}} \quad \text{[Equation 1]}$$

Here, $R_{dis}$ refers to the discharge internal resistance value, $OCV_{dis}$ refers to the voltage of the battery 10 at the start of discharging (refers to an open circuit voltage at the start of discharging), $V_{dis}$ refers to the voltage of the battery 10 at the end of discharging, and $I_{dis}$ refers to the magnitude of the discharge current (that is, the first set magnitude).

When the discharge internal resistance value is calculated, the control unit 50 may calculate the maximum discharge power according to the following Equation 2 on the basis of the calculated discharge internal resistance value.

$$\text{Discharge Power} = V_{MIN} \times \frac{(OCV_{dis} - V_{MIN})}{R_{dis}} \quad \text{[Equation 2]}$$

Here, discharge power refers to the maximum discharge power, and $V_{MIN}$ refers to a minimum discharging voltage.

When the maximum discharge power is calculated according to the Equation 2, the control unit 50 stops the control of the power conversion unit 30 for a predetermined idle time in which the voltage of the battery 10 reaches an open circuit voltage (OCV) before calculating the maximum charge power. The idle time is the time required for the voltage of the battery 10 to reach the open circuit voltage and enter a stable state, and when the battery 10 is not in the stable state, since the maximum discharge power and the maximum charge power calculated on the basis of the voltage and current of the battery 10 have an error, the control unit 50 waits until the voltage of the battery 10 reaches the open circuit voltage. The idle time is applied even before calculating the maximum discharge power.

When the voltage of the battery 10 reaches the open circuit voltage, as shown in FIG. 3, the control unit 50 may control the power conversion unit 30 to charge the battery 10 by supplying a charge current having a second set magnitude (for example, a current 3.75 times the capacity (3.75 C rate) of the battery 10) to the battery 10 for a set time (for example, ten seconds). In this case, the control unit 50 may calculate a charge internal resistance value on the basis of a voltage of the battery 10 at the start of charging, a voltage of the battery 10 at the end of charging, and a charge current. That is, since a voltage rise amount when the battery 10 is charged depends on the product of the magnitude of the charge current supplied to the battery 10 and the charge internal resistance value, the charge internal resistance value may be calculated according to the following Equation 3.

$$R_{chg} = \frac{(V_{chg} - OCV_{chg})}{I_{chg}} \qquad \text{[Equation 3]}$$

Here, $R_{chg}$ refers to the charge internal resistance value, $OCV_{chg}$ refers to the voltage of the battery 10 at the start of charging (refers to an open circuit voltage at the start of charging), $V_{chg}$ refers to the voltage of the battery 10 at the end of charging, and $I_{chg}$ refers to the magnitude of the charge current (that is, the second set magnitude).

When the charge internal resistance value is calculated, the control unit 50 may calculate the maximum charge power according to the following Equation 4 on the basis of the calculated charge internal resistance value.

$$\text{Charge Power} = V_{MAX} \times \frac{(V_{MAX} - OCV_{chg})}{R_{chg}} \qquad \text{[Equation 4]}$$

Here, charge power refers to the maximum charge power, and $V_{MAX}$ refers to a maximum charging voltage.

Meanwhile, the first and second set magnitudes and the set times which are described above may be variously selected according to the specifications of the battery 10 and the intention of a designer.

When the maximum discharge power and the maximum charge power are calculated, the control unit 50 may diagnose the power degradation of the battery 10 by respectively comparing the calculated maximum discharge power and the calculated maximum charge power with a preset required discharge power and a preset required charge power.

That is, to adjust a frequency in an energy storage system for adjusting a frequency, the required discharge power and the required charge power required for rating during charging and discharging are preset, and the calculated maximum discharge power and the calculated maximum charge power are respectively compared with the required discharge power and the required charge power through the above-described process, and thus the power degradation of the battery 10 may be diagnosed.

Meanwhile, in the present embodiment, the control unit 50 may calculate the maximum discharge power and the maximum charge power for each of a plurality of set states of charge (SOC) while sequentially adjusting the SOC of the battery 10 to each of the plurality of set SOCs (the SOCs may be preset as first to nth set SOCs (n is a natural number greater than or equal to 1 according to the order of magnitude of the SOCs), and may diagnose the power degradation of the battery 10 for each SOC using the maximum discharge power and the maximum charge power calculated for each SOC.

Specifically, in an energy storage system whose power characteristics are important such as the energy storage system for adjusting a frequency, an SOC range for securing power required for charging and discharging is determined. That is, since the power characteristics of the battery 10, and the required discharge power and the required charge power during charging and discharging are different according to the present SOC of the battery 10, the control unit 50 may calculate the maximum discharge power and the maximum charge power for each of the plurality of set SOCs of the battery 10, and respectively compare the maximum discharge power and the maximum charge power calculated for each SOC with the required discharge power and the required charge power required for each SOC to diagnose power degradation for each SOC.

The control unit 50 may diagnose the power degradation of the battery 10 for each SOC by performing one cycle composed of 'waiting for the idle time—calculating the maximum discharge power—waiting for the idle time—calculating the maximum charge power—diagnosing power degradation' for each set SOC while sequentially adjusting the SOC of the battery 10 to each of the plurality of set SOCs, and although FIG. 4 illustrates an example in which the plurality of set SOCs are set as 10%, 20%, . . . , 90%, the set SOCs may be variously designed and set according to the specifications of the battery 10 and the intention of the designer.

As described above, when the power degradation of the battery 10 for each SOC is diagnosed while sequentially adjusting the SOC of the battery 10 to each of the plurality of set SOCs, the control unit 50 may determine a usable SOC range for operating the battery 10 on the basis of the diagnosis result of the power degradation for each SOC of the battery 10.

That is, since the usable SOC range where the required power of the battery 10 may be normally expressed is determined on the basis of the diagnosis result of the power degradation for each SOC of the battery 10, and the influence of the power degradation of the battery 10 is minimized by operating the battery 10 in the determined usable SOC range, the battery 10 may be more stably operated.

Further, the control unit 50 may diagnose power degradation by temperature according to a temperature of the battery 10. That is, since the power characteristics of the battery 10 are changed according to the temperature of the battery 10, it is possible to manage by receiving the present temperature of the battery 10 from the battery management unit 20 and linking a power degradation degree to the temperature of the battery 10 in a process of diagnosing the power degradation of the battery 10. Since the battery 10 is operated by setting the temperature of the battery 10 at which the required power may be normally expressed through the above-described method, the energy storage system may be operated for a long time. FIG. 5 is an exemplary diagram illustrating results of diagnosing the power degradation in the cases in which temperatures of the battery 10 are 10° C. and 60° C.

Meanwhile, as described above, the control unit 50 may further diagnose capacity degradation in addition to the power degradation. As described above, the capacity degradation is defined as a case in which the capacity of the battery 10 is reduced due to aging of the battery 10. That is, the control unit 50 may determine a discharge capacity of the battery 10 on the basis of a discharge current measured while the fully charged battery 10 is fully discharged, and may further diagnose the capacity degradation of the battery 10 through a variation amount of the discharge capacity. Accordingly, the operation, maintenance, and repair of the battery 10 may be facilitated by comprehensively determining a system degradation degree including the power degradation and the capacity degradation of the battery 10, and predicting whether the battery 10 is abnormal in advance. A configuration which diagnoses the power degradation and a configuration which diagnoses the capacity degradation may be sequentially embodied, and time series sequencing is not limited to a specific order.

Figure 6:
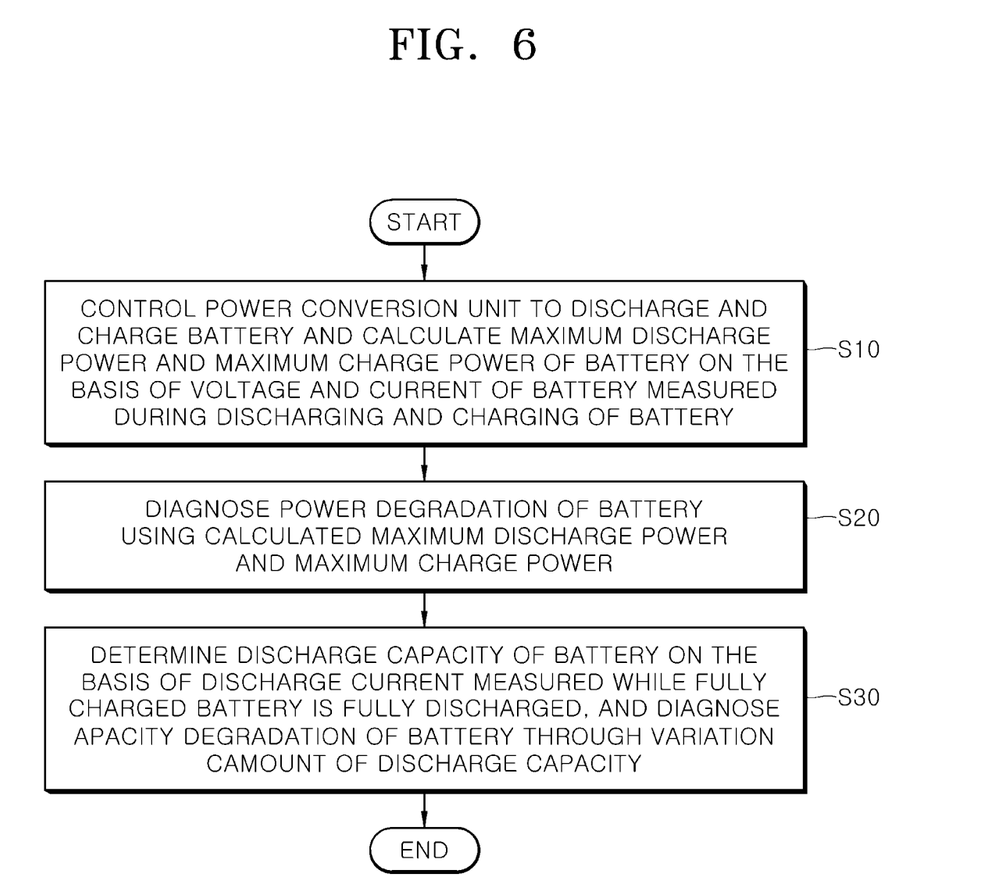
FIG. 6 is a flow chart for describing a method of diagnosing a battery according to one embodiment of the present invention.
Figure 7:
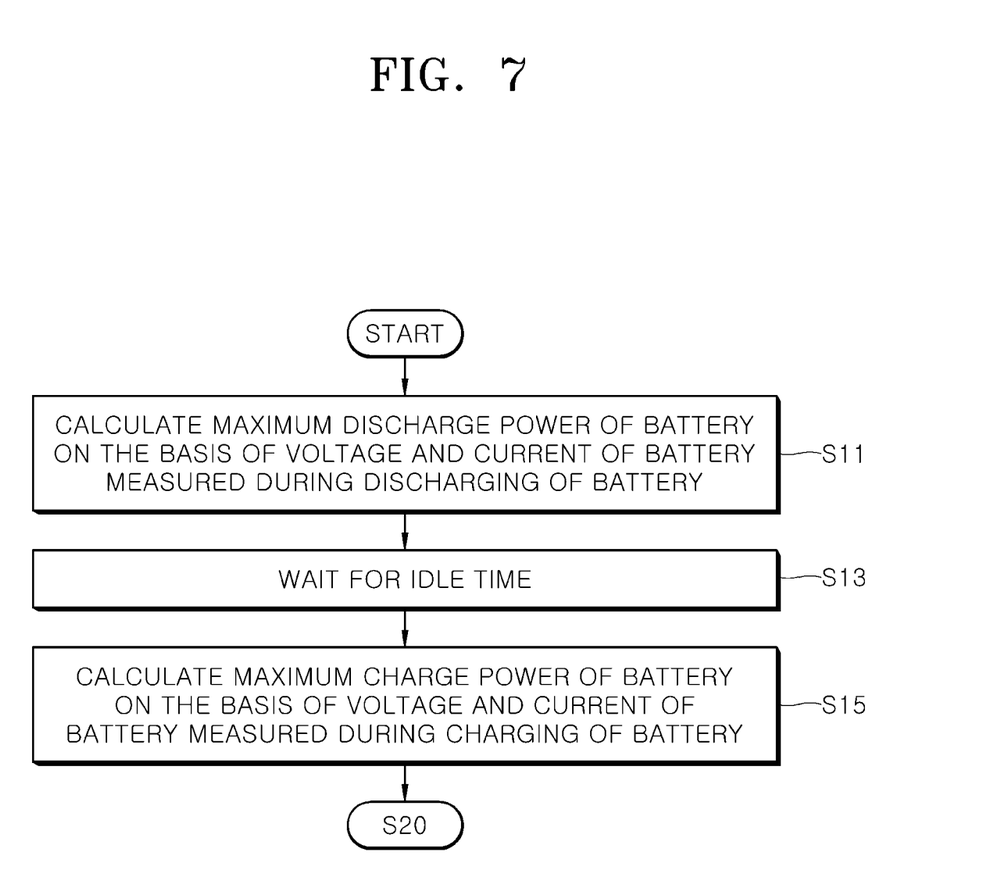
FIG. 7 is a flow chart for specifically describing a process of calculating a maximum discharge power and a maximum charge power in the method of diagnosing a battery according to one embodiment of the present invention.
Figure 8:
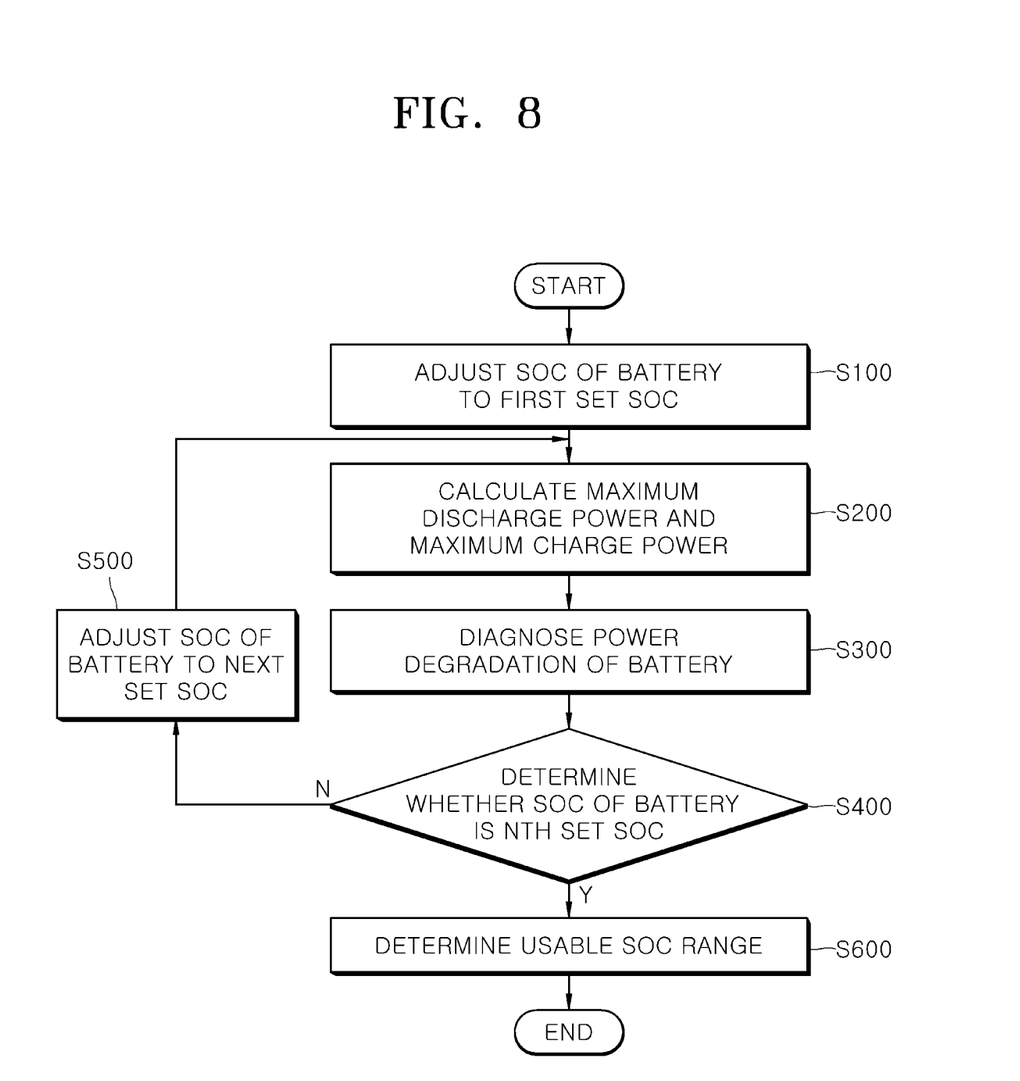
FIG. 8 is a flow chart for describing a process of diagnosing power degradation for each SOC of the battery in the method of diagnosing a battery according to one embodiment of the present invention.

FIG. 6 is a flow chart for describing a method of diagnosing a battery according to one embodiment of the present invention, FIG. 7 is a flow chart for specifically describing a process of calculating the maximum discharge power and the maximum charge power in the method of diagnosing the battery according to one embodiment of the present invention, and FIG. 8 is a flow chart for specifically describing a process of diagnosing the power degradation of the battery while changing an SOC of the battery to each of a plurality of set SOCs in the method of diagnosing the battery according to one embodiment of the present invention.

In a description of the method of diagnosing the battery according to one embodiment of the present invention with reference to FIG. 6, first, the control unit 50 controls the power conversion unit 30 which performs discharging and charging of the battery 10 to discharge and charge the battery 10, and calculates the maximum discharge power and the maximum charge power of the battery 10 on the basis of the voltage and current measured during discharging and charging of the battery 10 (S10).

Referring to FIG. 7, operation S10 in which the maximum discharge power and the maximum charge power of the battery 10 are calculated consists of a sequential configuration of operation S11 in which the maximum discharge power is calculated, operation S13 of waiting for a predetermined idle time in which the voltage of the battery 10 reaches the open circuit voltage, and operation S15 in which the maximum charge power is calculated.

First, in a specific description of operation S11, the control unit 50 controls the power conversion unit 30 to discharge the battery 10, and calculates the maximum discharge power of the battery 10 on the basis of the voltage and current of the battery 10 measured during discharging of the battery 10 (S11).

More specifically, the control unit 50 controls the power conversion unit 30 to discharge the battery 10 by drawing the discharge current having a first set magnitude from the battery 10, calculates the discharge internal resistance value on the basis of the voltage of the battery 10 at the start of discharging, the voltage of the battery 10 at the end of discharging, and the discharge current, and calculates the maximum discharge power on the basis of the calculated discharge internal resistance value. The description thereof is the same as described above through Equations 1 and 2 and thus specific descriptions will be omitted.

After operation S11, the control unit 50 stops control of the power conversion unit 30 during the predetermined idle time for the voltage of the battery 10 to reach the open circuit voltage (S13).

When the voltage of the battery 10 reaches the open circuit voltage, the control unit 50 controls the power conversion unit 30 to charge the battery 10, and calculates the maximum charge power of the battery 10 on the basis of the voltage and current of the battery 10 measured during charging of the battery 10 (S15).

More specifically, the control unit 50 controls the power conversion unit 30 to charge the battery 10 by supplying the charge current having a second set magnitude to battery 10, calculates the charge internal resistance value on the basis of the voltage of the battery 10 at the start of charging, the voltage of the battery 10 at the end of charging, and the charge current, and calculates the maximum charge power on the basis of the calculated charge internal resistance value. The description thereof is the same as described above through Equations 3 and 4 and thus specific descriptions will be omitted.

Meanwhile, a time series order in which operation S11 in which the maximum discharge power is calculated, and operation S15 in which the maximum charge power is calculated are performed is not limited to the above-described order, and may be realized as a time series configuration in which waiting for the predetermined idle time is performed after calculating the maximum charge power and then calculating the maximum discharge power is performed.

When the maximum discharge power and the maximum charge power are calculated through operation S10, the control unit 50 diagnoses the power degradation of the battery 10 using the calculated maximum discharge power and the calculated maximum charge power (S20). In this case, the control unit 50 may diagnose the power degradation of the battery 10 by respectively comparing the calculated maximum discharge power and the calculated maximum charge power with the preset required discharge power and the preset required charge power.

Meanwhile, as described above, the control unit 50 may diagnose the power degradation of the battery 10 for each SOC while sequentially adjusting the SOC of the battery 10 to each of the plurality of set SOCs, and to this end, in the method of diagnosing the battery according to the embodiment, operation S10 and operation S20 may be performed while sequentially adjusting the SOC of the battery 10 to each of the plurality of set SOCs.

That is, the control unit 50 may calculate the maximum discharge power and the maximum charge power for each of the plurality of set SOCs while sequentially adjusting the SOC of the battery 10 to each of the plurality of set SOCs in operation S10, and accordingly, the control unit 50 may diagnose the power degradation of the battery 10 for each SOC using the maximum discharge power and the maximum charge power calculated for each SOC in operation S20.

The above-described embodiment may be realized according to the flow chart shown in FIG. 8, and in a more specific description, first, the control unit 50 adjusts the SOC of the battery 10 to a first set SOC (S100).

In a state in which the SOC of the battery 10 is adjusted to the first set SOC, the control unit 50 calculates the maximum discharge power and the maximum charge power (S200), and diagnoses the power degradation of the battery 10 (S300).

Subsequently, when the present SOC of the battery 10 is not an nth set SOC (S400), the control unit 50 adjusts the SOC of the battery 10 to the next set SOC (that is, upwardly adjust the SOC of the battery 10 by a preset SOC increment (for example, 10%) (S500), and then repeats operation S200 to operation S400. The above-described process is repeatedly performed n times while the SOC of the battery 10 is sequentially adjusted from the first set SOC to the nth set SOC, and accordingly, the power degradation of the battery 10 for each SOC may be diagnosed.

Subsequently, the control unit 50 determines a usable SOC range for operating the battery 10 on the basis of the diagnosis result of the power degradation for each SOC (S600). That is, since the usable SOC range 10 where a required power of the battery 10 may be normally expressed on the basis of the diagnosis result of the power degradation for each SOC of the battery 10 is determined, and the influence of the power degradation of the battery 10 is minimized by operating the battery 10 in the determined usable SOC range, the battery 10 may be more stably operated.

The present invention will be described with reference to FIG. 6 again.

In the embodiment, as described above, the control unit 50 may diagnose capacity degradation in addition to the power degradation, and accordingly, the embodiment may further include operation S30 in which the control unit 50 determines a discharge capacity of the battery 10 on the basis of a discharge current measured while the fully charged battery 10 is fully discharged, and diagnoses the capacity degradation of the battery 10 through a variation amount of the discharge capacity. Accordingly, the operation, the maintenance, and the repair of the battery 10 may be facilitated by comprehensively determining a system degradation degree including the power degradation and the capacity degradation of the battery, and predicting whether the battery 10 is abnormal in advance. Meanwhile, operations S10 and S20 in which the power degradation is diagnosed and operation S30 in which the capacity degradation is diagnosed may be sequentially performed, and time series sequencing is not limited to a specific order.

As described above, the embodiment can more accurately diagnose stability and performance degradation of an entire system through a method of independently measuring a power degradation degree at a system level without depending on a state of health (SOH) calculated in a battery managing system, and can improve the operation efficiency of an energy storage system by predicting the power of a battery using the diagnosis result.

Further, the embodiment can operate the energy storage system for a long time by diagnosing power characteristics of the battery for each SOC of the battery, and operating the energy storage system in the SOC range where the required power may be normally expressed.

As described above, the present invention has been described with reference to embodiments shown in the drawings but these are only exemplary, and it may be understood by those skilled in the art that various modifications and other equivalents are possible therefrom. Accordingly, the technical scope of the present invention should be determined by the technical spirit of the appended claims.

The invention claimed is:

1. A battery diagnoistic apparatus comprising:
    a power conversion unit configured to perform discharging and charging of a battery; and
    a control unit configured to control the power conversion unit to discharge and charge the battery, and calculate a maximum discharge power and a maximum charge power of the battery on the basis of a voltage and a current of the battery measured during discharging and charging of the battery to diagnose power degradation of the battery, wherein the control unit controls the power conversion unit to draw a discharge current having a first set magnitude from the battery and discharge the battery, and to supply a charge current having a second set magnitude to the battery and charge the battery.

2. The battery diagnostic apparatus of claim 1, wherein the control unit calculates a discharge internal resistance value on the basis of a voltage of the battery at the start of discharging, a voltage of the battery at the end of discharging, and the discharge current, and calculates the maximum discharge power on the basis of the calculated discharge internal resistance value.

3. The battery diagnostic apparatus of claim 1, wherein the control unit calculates a charge internal resistance value on the basis of a voltage of the battery at the start of charging, a voltage of the battery at the end of charging, and the charge current, and calculates the maximum charge power on the basis of the calculated charge internal resistance value.

4. The battery diagnostic apparatus of claim 1, wherein the control unit diagnoses power degradation by temperature according to a temperature of the battery.

5. The battery diagnostic apparatus of claim 1, wherein the control unit determines a discharge capacity of the battery on the basis of a discharge current measured while a fully charged battery is fully discharged, and further diagnoses capacity degradation of the battery through a variation amount of the discharge capacity.

6. A battery diagnostic apparatus comprising:
    a power conversion unit configured to perform discharging and charging of a battery; and
    a control unit configured to control the power conversion unit to discharge and charge the battery, and calculate a maximum discharge power and a maximum charge poweer of the battery on the basis of a voltage and a current of the battery measured during discharging and charging of the battery to diagnose power degradation of the battery, wherein the control unit calculates the maximum discharge power and the maximum charge power for each of a plurality of set SOCs while sequentially adjusting a state of charge (SOC) of the battery to each of the plurality of set SOCs , and diagnoses power degradation for each SOC of the battery using the maximum discharge power and the maximum charge power calculated for each SOC.

7. The battery diagnostic apparatus of claim 6, wherein the control unit determines a usable SOC range for operating the battery on the basis of a diagnosis result of the power degradation for each SOC of the battery.

8. A battery diagnostic apparatus comprising:
    a power conversion unit configured to perform discharging and charging of a battery; and
    a control unit configured to control the power conversion unit to discharge and charge the battery, and calculate a maximum discharge power and a maximum charge power of the battery on the basis of a voltage and a current of
    the battery measured during discharging and charging of the battery to diagnose
    power degradation of the battery, wherein the control unit respectively compares the calculated maximum discharge power and maximum charge power with a required discharge power and a required charge power, which are preset, to diagnose the power degradation of the battery.

9. A method of diagnosing a battery, comprising:
    controlling, by a control unit, a power conversion unit configured to perform discharging and charging of a battery to discharge and charge the battery and calculating a maximum discharge power and a maximum charge power of the battery on the basis of a voltage and a current of the battery measured during discharging and charging of the battery; and diagnosing, by the control unit, power degradation of the battery using the calculated maximum discharge power and maximum charge power, wherein the control unit calculates the maximum discharge power and the maximum charge power of each of a plurality of set SOCs while sequentially adjusting a state of charge (SOC) of the battery to each of the plurality of set SOCs in the operation of calculating, and diagnoses power degradation for each SOC of the battery using the maximum discharge power and the maximum charge power calculated for each SOC in the operation of diagnosing.

10. The method of claim 9, wherein the calculating of the maximum discharge power and the maximum charge power includes controlling, by the control unit, the power conversion unit to discharge the battery and calculating the maximum discharge power of the battery on the basis of a voltage and a current of the battery measured when the battery is discharged, and controlling, by the control unit, the power conversion unit to charge the battery and calculating the maximum charge power of the battery on the basis of a voltage and a current of the battery measured when the battery is charged.

11. The method of claim 10, wherein the control unit controls the power conversion unit to supply a charge current having a second set magnitude to the battery to charge the battery, calculate a charge internal resistance value on the basis of a voltage of the battery at the start of charging, a voltage of the battery at the end of charging, and the charge current, and calculate the maximum charge power on the basis of the calculated charge internal resistance value, in the operation of calculating the maximum charge power.

12. The method of claim 9, further comprising determining, by the control unit, a usable SOC range for operating the battery on the basis of a diagnosis result of the power degradation for each SOC of the battery.

13. The method of claim 9, wherein the control unit respectively compares the calculated maximum discharge power and maximum charge power with a required discharge power and a required charge power, which are preset, to diagnose the power degradation of the battery in the operation of diagnosing.

14. The method of claim 9, further comprising determining, by the control unit, a discharge capacity of the battery on the basis of a discharge current measured while a fully charged battery is fully discharged, and diagnosing capacity degradation of the battery through a variation amount of the discharge capacity.

15. A method of diagnosing a battery, comprising:
controlling, by a control unit, a power conversion unit configured to perform discharging and charging of a battery to discharge and charge the battery and calculating a maximum discharge power and a maximum charge power of the battery on the basis of a voltage and a current of the battery measured during discharging and charging of the battery; and diagnosing, by the control unit, power degradation of the battery using the calculated maximum discharge power and maximum charge power, wherein the control unit controls the power conversion unit to draw a discharge current having a first set magnitude from the battery to discharge the battery, to calculate a discharge internal resistance value on the basis of a voltage of the battery at the start of discharging, a voltage of the battery at the end of discharging, and the discharge current, and to calculate the maximum discharge power on the basis of the calculated discharge internal resistance value, in the operation of calculating the maximum discharge power.

* * * * *